United States Patent
Yang et al.

(10) Patent No.: US 10,375,338 B2
(45) Date of Patent: Aug. 6, 2019

(54) TWO STAGE AMPLIFIER READOUT CIRCUIT IN PIXEL LEVEL HYBRID BOND IMAGE SENSORS

(71) Applicant: OmniVision Technologies, Inc., Santa Clara, CA (US)

(72) Inventors: Zheng Yang, San Jose, CA (US); Hiroaki Ebihara, San Jose, CA (US); Chun-Ming Tang, San Jose, CA (US); Chao-Fang Tsai, Nantou (TW); Rui Wang, San Jose, CA (US); Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 78 days.

(21) Appl. No.: 15/421,881

(22) Filed: Feb. 1, 2017

(65) Prior Publication Data
US 2018/0220094 A1  Aug. 2, 2018

(51) Int. Cl.
*H04N 5/378* (2011.01)
*H04N 5/369* (2011.01)
(Continued)

(52) U.S. Cl.
CPC ......... *H04N 5/378* (2013.01); *H01L 27/1464* (2013.01); *H01L 27/14612* (2013.01);
(Continued)

(58) Field of Classification Search
CPC ........ H04N 5/378; H04N 5/379; H04N 5/374; H04N 5/3741; H04N 5/3575; H04N 5/243;
(Continued)

(56) References Cited

U.S. PATENT DOCUMENTS 6,504,141 B1  1/2003  Kozlowski et al.
6,902,987 B1  6/2005  Tong et al.
(Continued)

OTHER PUBLICATIONS

Non-Final Office Action in U.S. Appl. No. 15/979,366, dated Oct. 4, 2018, 9 pages.
(Continued)

*Primary Examiner* — Twyler L Haskins
*Assistant Examiner* — Akshay Trehan
(74) *Attorney, Agent, or Firm* — Lathrop Gage LLP

(57) ABSTRACT

A hybrid bonded image sensor has a photodiode die with macrocells having at least one photodiode and a bond contact; a supporting circuitry die with multiple supercells, each supercell having at least one macrocell unit having a bond contact coupled to the bond contact of a macrocell of the photodiode die. Each macrocell unit lies within a supercell and has a reset transistor adapted to reset photodiodes of the macrocell of the photodiode die. Each supercell has at least one common source amplifier adapted to receive signal from the bond contact of a selected macrocell unit of the supercell, the common source amplifier coupled to drive a column line through a selectable source follower. In embodiments, the common source amplifiers of several supercells drive the selectable source follower through a distributed differential amplifier.

8 Claims, 5 Drawing Sheets

(51) Int. Cl.
H04N 5/374 (2011.01)
H01L 27/146 (2006.01)
H04N 5/3745 (2011.01)

(52) U.S. Cl.
CPC .. H01L 27/14634 (2013.01); H01L 27/14636 (2013.01); H01L 27/14643 (2013.01); H04N 5/374 (2013.01); H04N 5/379 (2018.08); H04N 5/37457 (2013.01)

(58) Field of Classification Search
CPC ............ H04N 5/37457; H04N 5/37455; H01L 27/14634; H01L 27/14612; H01L 27/14643; H01L 27/14636; H01L 27/1464
See application file for complete search history.

(56) References Cited

U.S. PATENT DOCUMENTS

| | | | |
|---|---|---|---|
| 7,230,479 B2 | 6/2007 | Forbes et al. | |
| 8,405,747 B2* | 3/2013 | Mo | H04N 5/378 348/245 |
| 8,773,562 B1* | 7/2014 | Fan | H01L 27/14643 348/308 |
| 9,064,769 B2 | 6/2015 | Kozlowski | |
| 2015/0179691 A1* | 6/2015 | Yanagita | H01L 27/14634 257/292 |
| 2016/0381311 A1* | 12/2016 | Guo | H04N 5/369 348/308 |
| 2017/0170223 A1* | 6/2017 | Hynecek | H01L 27/14634 |

OTHER PUBLICATIONS

Taiwan Patent Application No. 107102672, English translation of Office Action dated Jan. 31, 2019, 3 pages.
Chinese Patent Application No. 201810066877.9, Office Action dated Jan. 21, 2019, with brief English language summary, 6 pages.
Notice of Allowance in U.S. Appl. No. 15/421,807 dated Feb. 12, 2018.
Chen et al. (2009) "An Efficient BScan-Sample-Based ΣΔ Beamformer for Medical Ultrasound Imaging," IEEE Biomedical Circuits and Systems Cont. 285-288.
Xu "High-Speed Highly Sensitive CMOS Image Sensors," Ph.D. Thesis Defense, Hong Kong University of Science and Technology. 1-152.
Xu et al. (Oct. 2014) "A 1/2.5-inch VGA 400-fps CMOS Image Sensor with High Sensitivity," IEEE J. Solid-State Circuits. 49(1):2342-2351.
Xu et al. (Jun. 2012) "A 1500 fps Highly Sensitive 256×256 CMOS Imaging Sensor with In-Pixel Calibration," IEEE J. Solid-State Circuits. 47(6):1408-1418.
Xu et al. (2009) "Characterization and Analysis of Intra-Body Communication Channel," Int. Symp. Antennas and Propagation Soc. 1-4.
Xu et al. (2009) "Circuit-Coupled FEM Analysis of the Electric-Field Type Intra-Body Communication Channel," IEEE Biomedical Circuits and Systems Cont. 221-224.
Xu et al. (Sep. 2012) "Digitally Calibrated 768kS/s 1 O-bit Minimum-size SAR ADC Array with Dithering," IEEE J. Solid-State Circuits. 47(9):2129-2140.
Xu et al. (Mar. 2011) "Electric-Field Intrabody Communication Channel Modeling with Finite Element Method," IEEE Trans. Biomed. Eng. 58(3):705-712.
Xu et al. (Jul. 2012) "Equation Environment Coupling and Interference on the Electric-Field Intrabody Communication Channel," IEEE Trans. Biomed. Eng. 59(7):2051-2059.
Yuan et al. (Jan. 2012) "An Interpolation-Based Calibration Architecture for Pipeline ADC with Nonlinear Error," IEEE Trans. Instrum. Meas. 61(1):17-25.
Yuan et al. (Mar. 2012) "A 12-bit 20MS/s 56.3mW pipelined ADC with interpolation-based nonlinear calibration," IEEE Trans. Circuits Syst. I, Reg. Papers. 59(3):555-565.
Zhu et al. (2009) "High Speed Intra-Body Communication for Personal Health Care," IEEE Int. Cont. Eng. Med. Biol. Soc. 709-712.

* cited by examiner

TWO STAGE AMPLIFIER READOUT CIRCUIT IN PIXEL LEVEL HYBRID BOND IMAGE SENSORS

BACKGROUND

CMOS rectangular-array photosensor arrays are commonly used as image sensors in cameras. These arrays have an array of N by M (when N and M are both greater than 1 and often are unequal) photodiode-based photosensors each having at least one selection transistor having a gate coupled to a selection line. These arrays typically have precharge transistors arranged so to apply charge to the photodiode, and one or more sense transistors arranged to read post-exposure charge from the photodiode onto one or more bit lines; these arrays typically also have decoder-drivers configured to drive the selection lines and amplifiers fed by the bit lines, and in some embodiments may incorporate other circuitry.

SUMMARY

In an embodiment, a hybrid-bonded device having an array image sensor has a photodiode die with multiple macrocells, where each macrocell has at least one photodiode and a bond contact; and a supporting circuitry die having multiple supercells, each supercell with at least one macrocell unit, each macrocell unit having at least one bond contact coupled to the bond contact of a macrocell of the photodiode die and a reset transistor adapted to provide a "black" voltage to photodiodes of the macrocell of the photodiode die. Each supercell also includes at least one common source amplifier adapted to receive signal from the bond contact of a selected macrocell unit of the supercell, the common source amplifier coupled to drive a column line through a selectable source follower.

In another embodiment, a method of forming digitized pixel data using a photodiode die including precharging a photodiode of the photodiode die; exposing the photodiode to light; coupling a signal from the photodiode of the photodiode die through a bond to a macrocell unit of a supporting circuitry die, the macrocell unit comprising at least an input transistor of a common source amplifier; amplifying, using the common source amplifier, the signal from the photodiode of the photodiode die; coupling a signal from the common source amplifier to an analog-to-digital converter; and forming digitized pixel data by steps comprising digitizing the signal in the analog-to-digital converter.

DETAILED DESCRIPTION OF THE EMBODIMENTS

Figure 1:
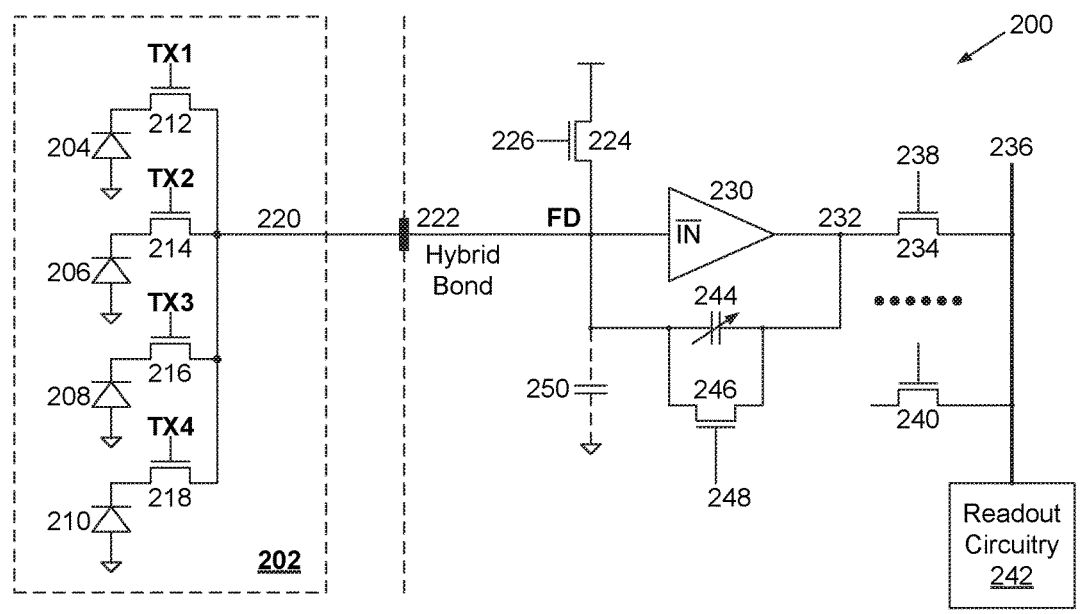
FIG. 1 is a schematic diagram of a macrocell and macrocell unit in a pixel-level bonded image sensor array, showing a photodiode-die macrocell, an inter-die bond, and associated amplification circuitry, and a column readout circuitry.

Typical CMOS image sensors have their reset and transfer transistors, decoder-drivers, buffers, gain amplifiers, and photodiodes all fabricated in the same monolithic integrated circuit substrate. This necessarily requires reserving some active area near each photodiode for the transistors, as well as associated interconnect such as the selection and bit lines. As cameras become smaller, to fit in thin devices like cell phones, and the market demands larger pixel counts, less and less surface area is allowed for each photodiode. Since signal levels depend on photons received by each photodiode, it is desirable to maximize the proportion of image-sensor area devoted to the photodiodes to maintain sensitivity.

Silicon is the semiconductor material most commonly used for CMOS electronic circuitry. While other semiconductor materials give improved sensitivity at specific wavelengths, it can be difficult to design and fabricate decoders, amplifiers, and other circuitry in those materials. For example, photodiodes fabricated of gallium arsenide (GaAs), gallium indium phosphide (GaInP), indium gallium arsenide (InGaAs) and germanium (Ge) may respond to wavelengths longer than those wavelengths of light silicon photodiodes typically respond to. Image sensors responsive to long wavelength, infrared, light may be useful in military and security systems, while those using silicon photodiodes are commonly used in cell phones, and visible-light cameras.

An image sensor is built from two separately-fabricated integrated circuit die bonded together to form a structure having two active layers, a photodiode layer fabricated from silicon or from another semiconductor material, such as germanium, gallium arsenide, indium gallium arsenide, gallium nitride, mercury telluride, or indium phosphide, selected according to the wavelengths for which the image sensor is intended for use, and a supporting circuitry layer fabricated in a monolithic silicon CMOS process. The supporting circuitry layer includes signal amplifiers, multiplexors, and similar circuits and, in some embodiments, analog to digital conversion and digital image processing circuitry as well. The pixel-level bond architecture, with photodiodes on a different die than the die having supporting circuitry, not only permits using a greater percentage of photodiode-die area for photodiodes, but permits optimizing processing and materials of the photodiode die for photodiodes, while optimizing processing of the supporting circuitry die for the supporting CMOS circuitry.

Pixel-level bond architecture typically involves photodiode die with a small number, such as two, four, eight, or sixteen, of photodiodes associated with each bond contact provided for electrical connection between the photodiode die and the supporting circuitry die.

Integrated circuits typically have a front side, a surface of a wafer into which implants have been made to create regions such as transistor source and drain, gate oxide grown, upon which polysilicon for gates was deposited, and on which at least one level of metal interconnect was deposited. Integrated circuits also have a backside, opposite the front side. Backside-illuminated (BSI) photodiode die are those thinned and configured for incoming light to penetrate the backside of the circuit die to reach photodiodes of the die. Front side illuminated (FSI) photodiode die are those configured for light to reach photodiodes through the front side of the circuit die. In a particular embodiment of the present system, BSI photodiode die are used and are bonded to the supporting circuitry die.

In an alternative embodiment, a similar multilayer structure is formed by depositing a second semiconductor layer over integrated circuitry formed in a first integrated circuit die, the first integrated circuit die having the supporting circuitry, and the photodiodes formed in the second semiconductor layer.

FIG. 1, Basic Sensing

In an embodiment, a 4-photodiode macrocell 200 has a photodiode macrocell 202 with four photodiodes, 204, 206, 208, and 210. Alternative embodiments have 2, 4, 8 or 16 photodiodes per macrocell. Each photodiode 204, 206, 208, 210 is coupled through a transfer transistor 212, 214, 216, 218 respectively, to a macrocell data line 220, the transfer transistors 212, 214, 216, 218 are controlled by transfer lines TX1, TX2, TX3, and TX4 respectively. Macrocell data line 220 is coupled from the photodiode die to the support circuitry by a bond contact 222, in the support circuitry die macrocell data line 220 couples to a macrocell reset transistor 224 controlled by a reset line 226; in operation one or more transfer transistors of transfer transistors 212-218 is enabled by a photodiode transfer enable line TX1-4 while reset transistor 224 is activated to apply a black-level voltage to a photodiode of photodiodes 204-210 during a reset phase; after the reset phase completes photodiode select lines are driven low to disable the transfer transistors 212-218 and the photodiodes 204-210 are exposed to light for an exposure time to accumulate photocurrent thereby reducing voltage on the photodiode—the reduced voltage forms an image. The reset lines may also be driven low. In a particular embodiment, all four transfer transistors are enabled simultaneously to reset all four photodiodes 204-210. In alternative embodiments, the transfer transistors are sequentially activated by TX1-4 lines to reset the photodiodes.

Macrocell data line 220 also couples to an inverting input of an amplifier 230, in an embodiment amplifier 230 is distributed among multiple macrocells and lies within a supercell. Amplifier 230 has output 232 coupled through a row select transistor 234 controlled by row select line 238 to a column bit line 236. Column bit line 236 couples to through additional row select transistors 240 to other supercells that may drive column output line 236 when supercell 200 is not selected. Column output line 236 conveys signal to column amplifiers, multiplexors, and analog-to-digital converter (AMP-MUX-ADC) 242 that provide image data output from the image sensor.

During operation, after photodiodes 204-210 have been reset and exposed to light for the exposure time, and reset transistor 224 is disabled by reset line 226 following proper sequence, a photodiode transfer line of photodiode select lines TX1-4 is activated along with row select line 238 to enable row select transistor 234. All other row select transistors 240 associated with other photodiodes of the same macrocell, and row select transistors associated with other macrocells of the supercell coupled to column bit line 236, turned off. An image-dependent voltage on the selected photodiode of photodiodes 204-210 is then amplified in amplifier 230 by a gain, the amplified image-dependent voltage provided to AMP-MUX & ADC readout circuitry 242 where it is digitized for further processing. The selected photodiode is deselected, and further photodiodes of macrocell 202 are read by resetting amplifier 230, selecting the further photodiode with a transfer enable line of transfer enable lines TX1-4, amplifying photodiode voltage, and sending amplified photodiode voltage to AMP-MUX & ADC readout circuitry 242 as previously described.

Figure 2:
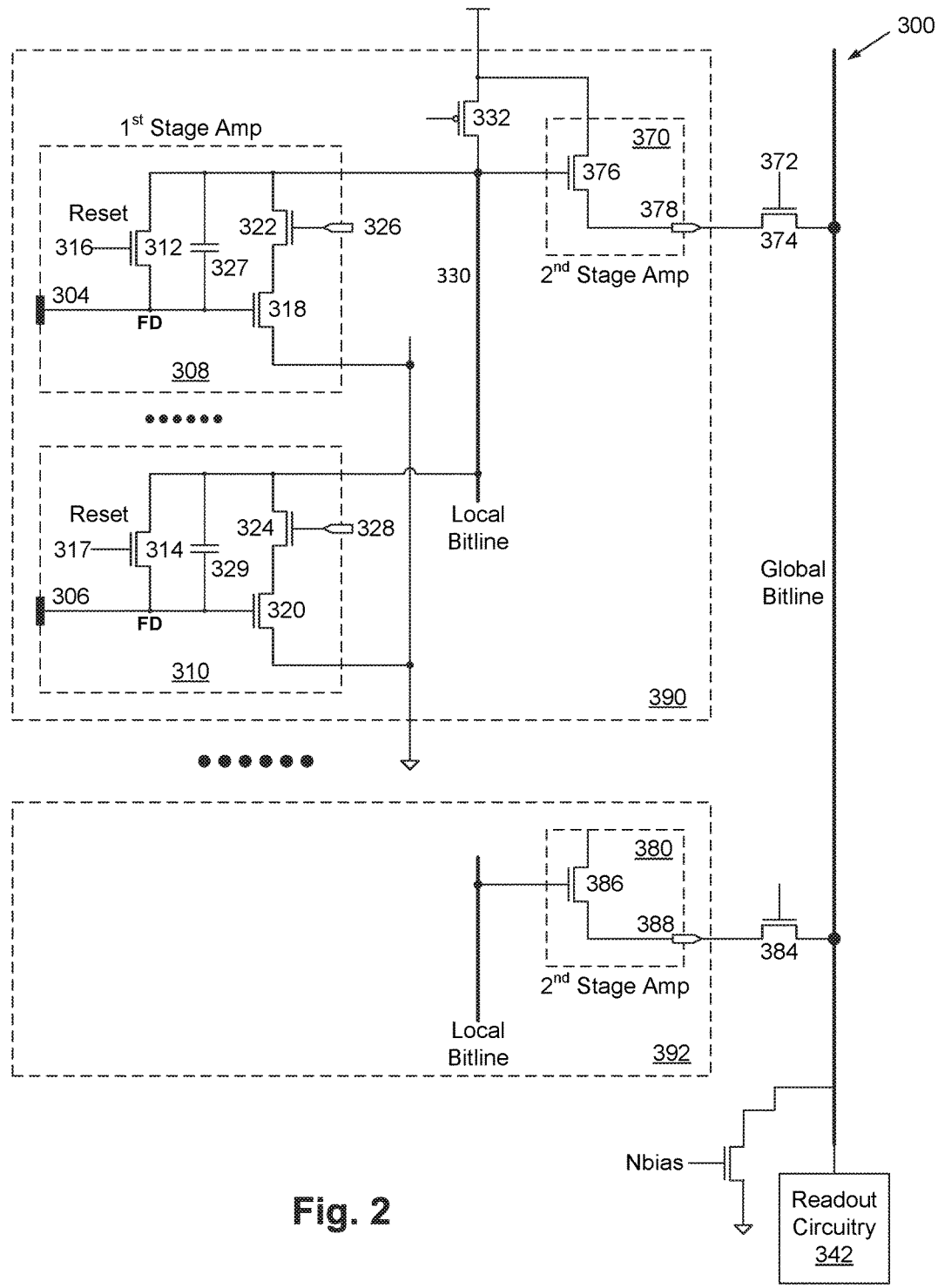
FIG. 2 is a schematic diagram of an embodiment of a first stage and a second stage amplification circuitry in an embodiment.

FIG. 2 Shared Source Follower Supercell

In a particular embodiment of a supercell 300 (FIG. 3), incorporating one or more macrocells, each macrocell of the photodiode die (not shown for simplicity, similar to that of FIG. 1) bonds to a bond contact 304, 306 in a three-transistor macrocell unit 308, 310 of the support circuitry die. In certain embodiments, there may be 2, 4, 8, or 16 macrocell units per supercell 300. Each macrocell unit 308, 310 also has a Reset transistor 312, 314 (corresponding roughly to reset transistor 224 of FIG. 1) controlled by a Reset control line Reset 316, 317. Reset control line 316, 317 may in some embodiments be common to all macrocell units of supercell 300, and in other embodiments Reset control line 316, 317 is separate for each macrocell unit of supercell 300 but is common across multiple columns of supercells. Also within macrocell unit 308, 310 is an amplifier transistor 318, 320 (corresponding roughly to amplifier 230 of FIG. 1) having gate connected to bond contact 304, 306, the amplifier 318, 320 being coupled in series with a cascode and selection transistor 322, 324. Each cascode and selection transistor has gate connected to a separate macrocell selection line 326, 328 and drain connected to a common macrocell bit line 330. Each macrocell unit also has a feedback and gain-setting capacitor 327, 329, the second gain setting capacitor 329 may be a parasitic capacitance. A load and precharge transistor 332 provides a common load for amplifier transistors 318, 320.

In an alternative embodiment, one or both of feedback and gain setting capacitor 327 and 329 has configurable capacitance and is useable to adjust gain.

During read operations of photodiodes coupled to a particular macrocell unit 308, the macrocell selection line 326 of that macrocell unit is driven to a high level, while all macrocell selection lines 328 of other macrocells 310 in the supercell 300 are driven low to deselect those macrocells. The amplifier input transistor 318 of the selected macrocell 308 thus becomes an inverting input of an amplifier (first stage) formed of selected input transistor 318 and load transistor 332.

The amplifier output 330 of the first stage is coupled to a selectable source-follower 370 provided to buffer amplifier (second stage) output 378 to keep capacitive loading of both local bitline and global bitline low. Selectable source-follower 370 operates under control of a supercell selection line 372 (RD) and has a selection transistor 374 and follower transistor 376 configured to provide a buffered supercell output 378 coupled to a column global bit line.

FIG. 3, Hypercell

Figure 3:
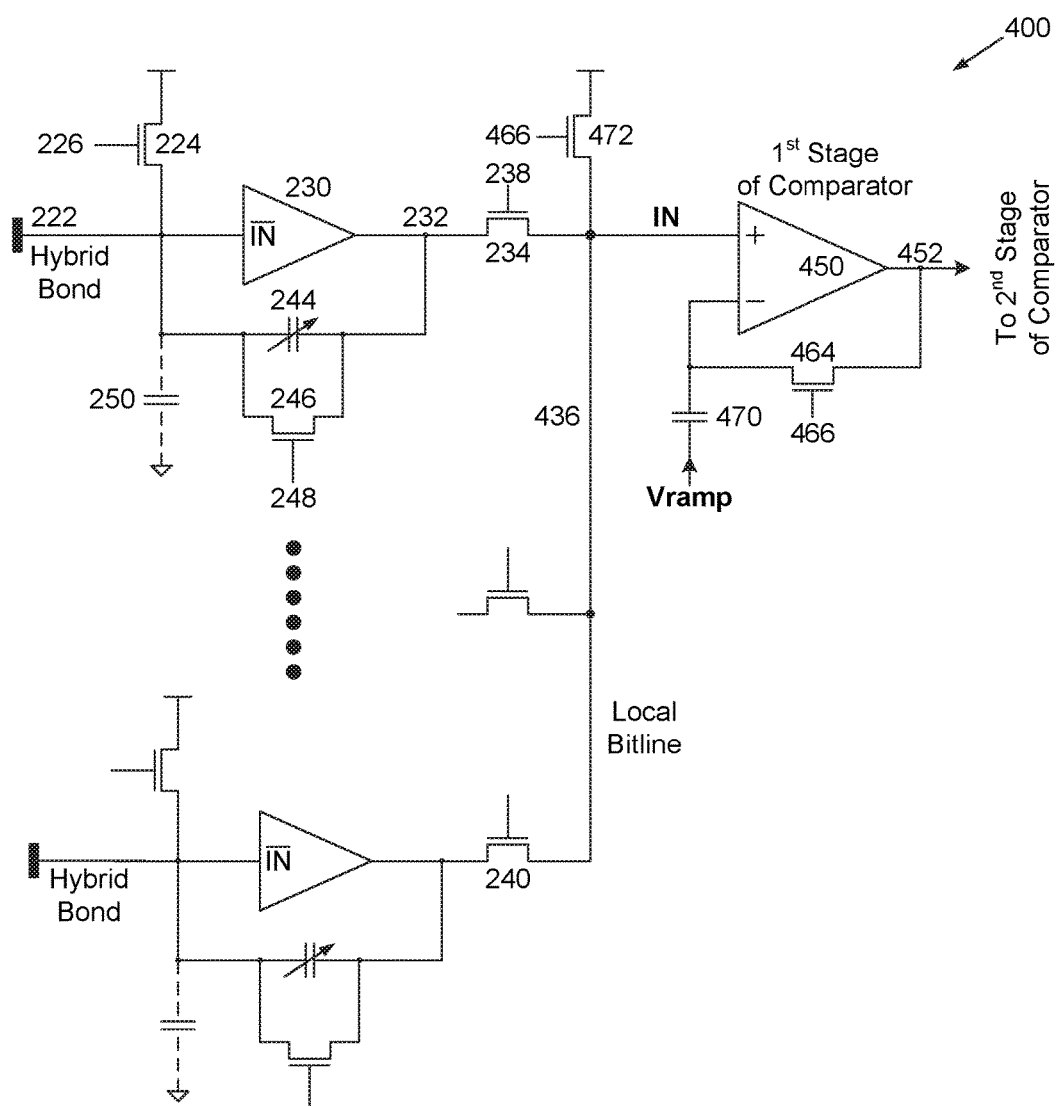
FIG. 3 is a schematic diagram of another alternative embodiment of an amplification circuitry coupled to a first stage of comparator.

In an alternative embodiment 400 (FIG. 3), an enhancement of that of FIG. 1, in order to provide additional, controlled, gain and selection functions for a larger group of macrocells. In FIG. 3, components having the same reference number as components in FIG. 1 have essentially the same function, while those having different reference numbers are functionally as described here. Details of the photodiode die macrocells are shown on FIG. 1 to save space on FIG. 3.

Each photodiode macrocell data line 220 couples through a bond 222 to a macrocell reset transistor 224 controlled by a reset line 226; in operation one or more transfer transistors of transfer transistors 212-218 is enabled by a photodiode transfer enable line TX1-4 of the photodiode die (see FIG. 1) while reset transistor 224 is activated by reset line 226 to apply charge to a photodiode of photodiodes 204-210 during a precharge phase; after the precharge phase completes the photodiode transfer enable lines are driven low to disable the transfer transistors 212-218 and the photodiodes 204-210 are exposed to light for an exposure time to accumulate photocurrent—remaining voltage forms an image. In a particular embodiment, all four transfer transistors are enabled simultaneously to reset all four photodiodes 204-210. In alternative embodiments, the transfer transistors are sequentially activated to sequentially reset the photodiodes.

Macrocell data line 220 also couples to an inverting input of common-source amplifier 230 (FIG. 3), common source amplifier 230 has output 232 coupled through a row select transistor 234 controlled by row select line 238 to a local bit (or output) line 436. Local bit line 436 couples to additional amplifiers associated with additional photodiode-die macrocells through additional row select transistors 240.

Instead of coupling directly to an amplifiers, multiplexors, and ADC local bit line 436 drives a noninverting input of a differential amplifier 450 having differential amplifier output 452.

Within hypercell 400, differential amplifier output 452 couples through an amplifier reset transistor 464 to an inverting input of differential amplifier 450, amplifier reset transistor 464 is controlled by an amplifier reset line 466. In embodiments, additional signals, such as a ramp signal Vramp may be introduced through a coupling capacitor 470 to the inverting input of differential amplifier 450. In a particular embodiment, 450 serves as a first stage of a comparator, participating in an ADC function by comparing local bit line 436 and Vramp In a particular embodiment, local bit line 436 has an amplifier reset transistor 472 controlled by amplifier reset line 466. In an alternative embodiment, reset transistor 472 is omitted and local bit line 436 is reset by enabling row select line 238 while amplifier reset transistor 246 is enabled.

During operation, after photodiodes 204-210 have been reset and exposed to light for the exposure time, and reset transistor 224 disabled, the photodiodes are read by activating one transfer enable line TX1-4. Prior to activating any transfer enable line TX1-4, a pulse is provided on amplifier reset line 248 and a particular amplifier 230 is selected by enabling a particular row select line 238 while differential amplifier reset line 466 is active. Amplifier reset line 226 and differential amplifier reset line 466 are then zeroed.

A photodiode transfer line of photodiode transfer enable lines TX1-4 is activated while row select transistor 234 remains on with all other row select transistors 240 associated with other macrocells coupled to local bit line 236 turned off. An image-dependent voltage on the selected photodiode of photodiodes 204-210 is then amplified in amplifier 230 by a gain, output of amplifier 230 is amplified in differential amplifier 450 and subsequently fed to additional circuitry of the support circuitry die for additional processing including digitization. The selected photodiode is deselected, and further photodiodes of macrocell 202 are read by resetting amplifier 230 and differential amplifier 450, selecting the further photodiode with a transfer enable line of transfer enable lines TX1-4, amplifying photodiode voltage, sending amplified photodiode signal voltage to differential amplifier 450, and fed to additional circuitry of the support circuitry die as previously described.

Feedback capacitor 244 is provided to set gain of amplifier 230, and a reset transistor 246, operating under control of an amplifier reset line 248, is provided to zero the amplifier prior to reading each photodiode; in these embodiments gain is set by a ratio of capacitor 244 to a second capacitance 250—although part or all of second capacitance 250 may be parasitic capacitance. In embodiments, the differential amplifier 450 is a distributed differential amplifier.

In the embodiments of FIG. 2 and FIG. 3, macrocell selection lines 326, 328, current source bias voltage, supercell selection line 372, precharge line 316, 317, and cascode bias lines 332 are provided by decoding, driving, and bias voltage circuitry external to, and typically located adjacent to, the image sensor array.

Hypercell with Distributed Common Source and Differential Amplifiers

Figure 4:
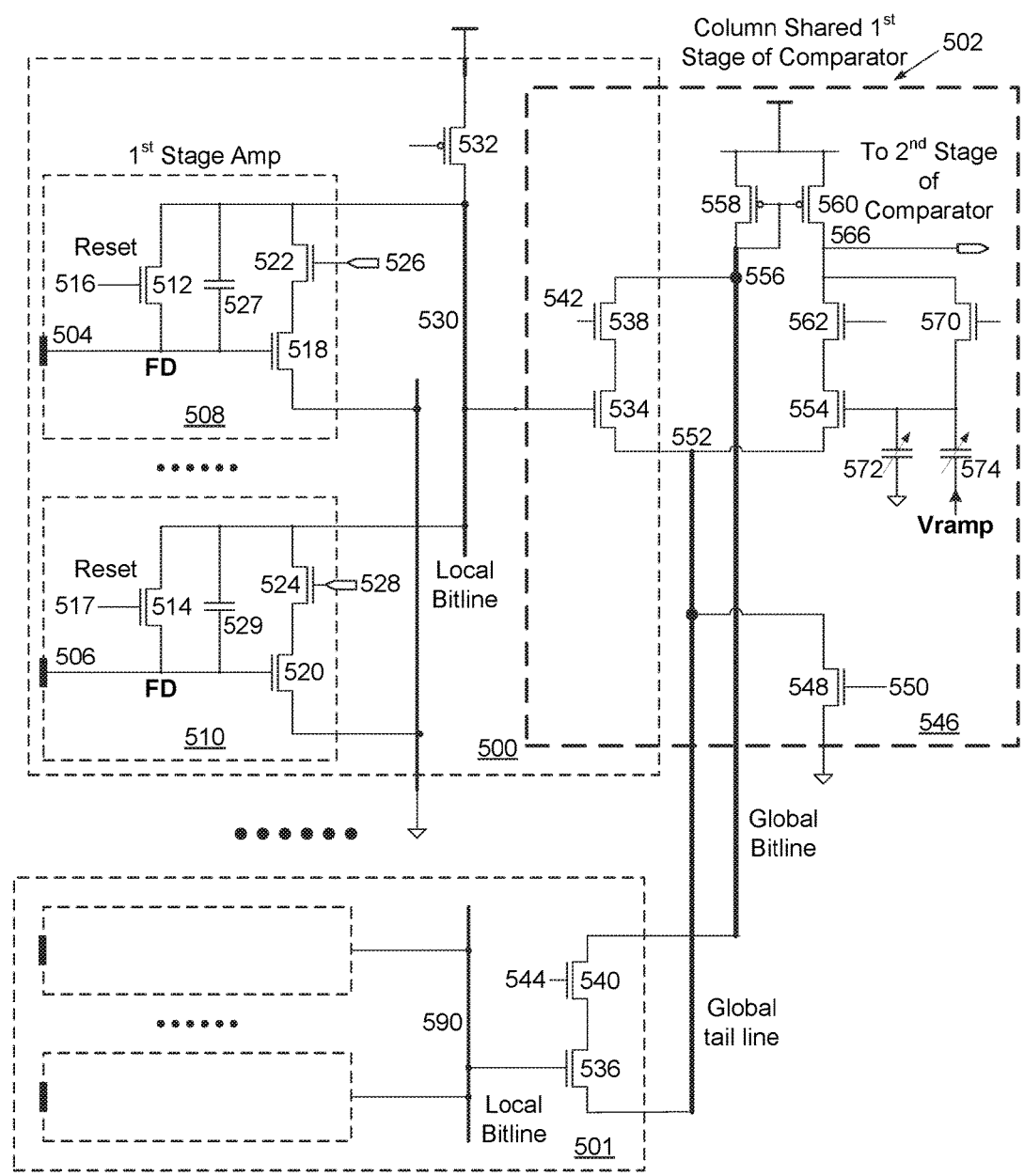
FIG. 4 is a detailed schematic diagram of an embodiment according to FIG. 3, showing detail of how the differential amplifier is distributed across multiple supercells.

A more detailed illustration of the image sensor sensing hypercell of FIG. 3, implemented with common source amplifiers distributed into the macrocells and the differential amplifier noninverting inputs distributed into the supercells is illustrated in FIG. 4.

Within a first supercell 500 of a hypercell 502, (FIG. 4), incorporating one or more macrocell units 508, 510, each coupled to a macrocell having at least one photodiode of the photodiode die (not shown for simplicity, similar to the photodiode macrocell 202 of FIG. 1). Each macrocell of the photodiode die connects to a bond contact 504, 506 in a three-transistor macrocell unit 508, 510 of the support circuitry die. While two macrocell units are illustrated for simplicity, in embodiments, there may be 2, 4, 8, 16 or 32 macrocell units per supercell 500. Each macrocell unit 508, 510 also has a reset transistor 512, 514 controlled by a reset control line Reset 516, may be common to all macrocell units of supercell 500. Also within macrocell unit 508, 510 is a common-source amplifier transistor 518, 520 having gate connected to bond contact 504, 506, the amplifier transistor 518, 520 being coupled in series with a cascode and selection transistors 522, 524, only one cascode and selection transistor 522, 524 may be conductive at any one time. Each cascode and selection transistor has gate connected to a separate macrocell selection line 526, 528 and drain connected to a common macrocell bit line 530 that may connect to additional macrocell units of the supercell. Each macrocell unit also has a feedback and gain-setting capacitor 527, 529, the second gain setting capacitor of each common-source amplifier is a parasitic capacitance. A load and precharge transistor 532 provides a common load for amplifier transistors 518, 520.

During read operations of photodiodes coupled to a particular macrocell unit 508, the macrocell selection line 526 of that macrocell unit is driven to a high level, while all macrocell selection lines 528 of other macrocells 510 in the supercell 500 are driven low to deselect those macrocells. The amplifier input transistor 518 of the selected macrocell 508 thus becomes an inverting input of an amplifier formed of selected input transistor 518 and load transistor 532.

Also located within each supercell are a differential amplifier noninverting input transistor 534, 536 and a differential amplifier selection and cascode transistor 538, 540. Noninverting input transistor 534, 536 is driven by common macrocell bit line 530 and 590 of the supercell within which noninverting input transistor 534, 536 lies, respectively, while only two supercells 500, 501 are illustrated, it is anticipated that embodiments may have 100 or 200 supercells per hypercell. Differential amplifier selection and cascode transistor 538, 540 has gate driven by a selection line 542, 544 unique to a row of supercells, and configured such that no more than one selection line 542, 544 may be active at any one time in each hypercell. In this embodiment, a hypercell typically encompasses an entire column of the image sensor array, consisting of a first stage comparator 546, a global bit line 556 and a global tail line 552 to be shared by 100 or 200 supercells.

Within remaining circuitry of the hypercell is a differential amplifier current source transistor 548, with gate driven by a current control voltage line 550 that is common to many hypercells serving each column of the image sensor. Drain of current source transistor 548 provides current to a current source line 552 that feeds the differential amplifier noninverting input transistors 534 of each supercell of the hypercell, as well as a common inverting input transistor 554. Similarly, the selection and cascode transistors 538, 540 associated with each supercell are coupled to a common load line 556, the global bit line of the supercell. Common load line 556 is provided with an active load in form of load transistors 558, 560. Inverting input transistor 554 has drain coupled through an inverting cascode transistor 562 to an output 566 of the differential amplifier coupled to a side of the active load opposite the common load line 556.

Differential amplifier output 566 couples through a differential amplifier reset transistor 570 to the inverting input of the differential amplifier, the inverting input of the amplifier also couples through a gain control capacitor 572 to a voltage divider formed by capacitors 572 and 574. Voltage divider capacitor 574 receives an input signal Vramp.

Differential amplifier output 566 provides an output that in an embodiment drives the second stage of the comparator.

It is anticipated that different amplifiers, including multistage differential amplifiers, may be used in alternative embodiments of the image sensor.

Figure 5:
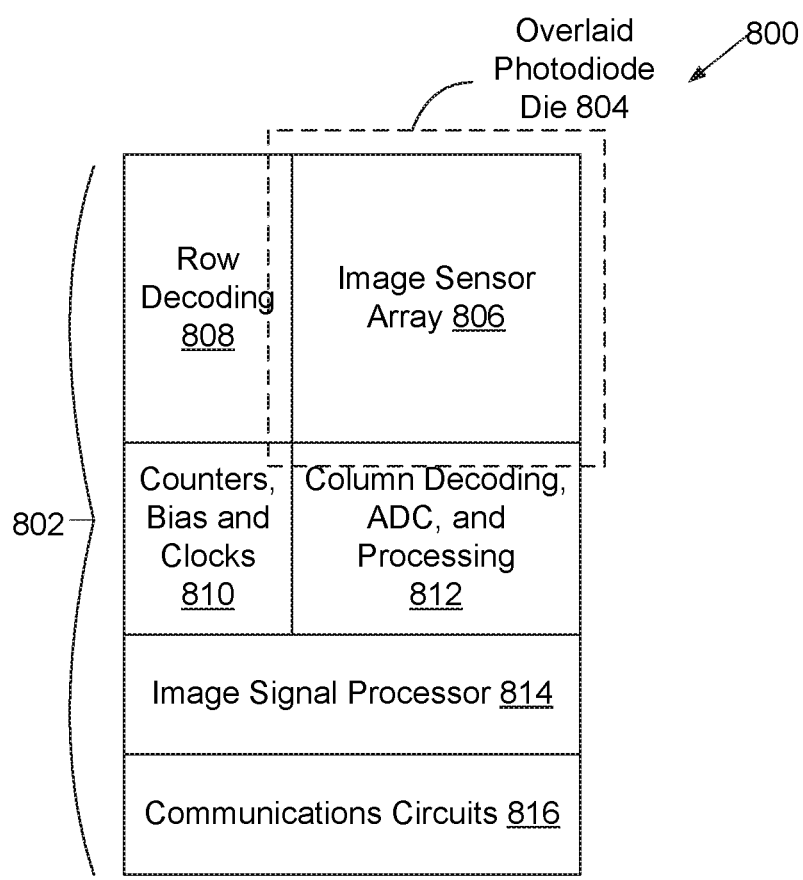
FIG. 5 is a block diagram of a generic camera system incorporating the pixel-level hybrid bonded image sensor.

FIG. 5 An Integrated Camera

An integrated camera 800 (FIG. 5) has a supporting circuitry die 802 with a backside-illuminated photodiode die 804 bonded to it. The supporting circuitry die has supercell supporting circuitry as described in accordance with FIG. 1, 2, 3, or 6 acting in concert with the photodiode die 804 as an image sensor array 806. The image sensor array 806 is driven by row decoders 808, which in an embodiment include a macrocell photodiode-selection decoder for driving photodiode transfer enable lines such as TX1-TX4 of FIG. 1 and a supercell selection decoder for driving supercell selection lines such as 238 of FIG. 1, source-follower selection lines 372, of FIG. 2, operating under control of counters, bias, and clock circuits 810, and sensed image data is processed by column sensing, ADC, and processing circuits 812 to provide a digital image. The digital image is processed by image processor 814 and communicated to a host system by communications circuits 816.

While each of FIG. 2, FIG. 3, and FIG. 4 illustrate two macrocell circuits per supercell, and two supercells per hypercell, it is intended that other numbers of macrocell circuits may be provided within each supercell of the supporting circuitry die; in particular it is likely four or eight macrocell circuits may be used in supercells of particular embodiments.

Combinations

Features described herein may be present in different combinations within a single camera system. Among combinations of features anticipated are:

A hybrid bonded image sensor designated A including a photodiode die with multiple macrocells, where each macrocell has at least one photodiode and a bond contact; and a supporting circuitry die having multiple supercells, each supercell with at least one macrocell unit, each macrocell unit having at least one bond contact electrically connected to the bond contact of a macrocell of the photodiode die and a precharge transistor adapted to provide a precharge to photodiodes of the macrocell of the photodiode die. Each supercell also includes at least one common source amplifier adapted to receive signal from the bond contact of a selected macrocell unit of the supercell, the common source amplifier coupled to drive a column line through a selectable source follower.

A hybrid bonded image sensor designated AA including the hybrid bonded image sensor designated A wherein the at least one common source amplifier of each supercell is a distributed common source amplifier having an amplifier input transistor and a selection transistor for each macrocell unit and a common load.

A hybrid bonded image sensor designated AB including the hybrid bonded image sensor designated A or AA wherein the at least one common source amplifier of each supercell further comprises a capacitor coupled between an output of the common source amplifier and the bond contact of the selected macrocell unit of the supercell.

A hybrid bonded image sensor designated AC including the hybrid bonded image sensor designated A, AA or AB wherein the common source amplifier is coupled to the selectable source follower through a differential amplifier, and wherein a noninverting input of the differential amplifier receives an output of the common source amplifier.

A hybrid bonded image sensor designated AD including the hybrid bonded image sensor designated AC wherein the differential amplifier is a distributed differential amplifier having a separate noninverting input for each of a plurality of supercells and a common load.

A hybrid bonded image sensor designated AE including the hybrid bonded image sensor designated AC or AD wherein the differential amplifier further comprises a first gain-controlling capacitor coupled between an output of the differential amplifier and a noninverting input of the differential amplifier, and a second gain-controlling capacitor coupled between the noninverting input of the differential amplifier and a signal ground.

A camera system designated B incorporating the image sensor designated A, AA, AB, AC, AD, or AE, the image sensor further comprising at least one decoder coupled to drive photodiode select lines of macrocells of the array, to supercell select lines, and column select lines, the camera system further including an analog-to-digital converter coupled to receive data from the image sensor, at least one counter coupled to the at least one decoder, and a digital processor coupled to receive data from the analog-to-digital convertor; wherein the analog-to-digital convertor, counter, and digital processor are formed in the supporting circuitry die; and wherein the photodiode die is configured for backside illumination.

A method designated C of forming digitized pixel data using a photodiode die including precharging a photodiode of the photodiode die; exposing the photodiode to light; coupling a signal from the photodiode of the photodiode die through a bond to a macrocell circuit of a supporting circuitry die, the macrocell circuit comprising at least an input transistor of a common source amplifier; amplifying, using the common source amplifier, the signal from the photodiode of the photodiode die; coupling a signal from the common source amplifier to an analog-to-digital converter; and forming digitized pixel data by steps comprising digitizing the signal in the analog-to-digital convertor.

A method designated CA including the method designated C wherein the common source amplifier is a distributed common source amplifier having a separate input transistor associated with each of a plurality of macrocell circuits.

A method designated CB including the method designated C or CA wherein coupling the signal from the common source amplifier to an analog to digital converter comprises coupling the signal into a noninverting input of a differential amplifier, and coupling an output of the differential amplifier to the analog to digital converter.

A method designated CC including the method designated C, CA, or CB wherein coupling the signal from the common source amplifier to an analog to digital converter comprises driving a column bit line with a selectable source follower.

CONCLUSIONS

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A hybrid bonded image sensor comprising:
   a photodiode die comprising a plurality of macrocells, where each macrocell comprises at least one photodiode and a bond contact;
   a supporting circuitry die comprising a plurality of supercells, each supercell comprising at least one macrocell unit, each macrocell unit comprising at least one bond contact electrically connected to the bond contact of a macrocell of the photodiode die and a precharge transistor adapted to provide a precharge to photodiodes of the macrocell of the photodiode die;
   each supercell comprising at least one common source amplifier adapted to receive signal from the bond contact of a selected macrocell unit of the supercell, the common source amplifier coupled to drive a column bit line through a selectable source follower.

2. The hybrid bonded image sensor of claim 1 wherein the at least one common source amplifier of each supercell is a distributed common source amplifier having an amplifier input transistor and a selection transistor for each macrocell unit and further comprising a common load.

3. The hybrid bonded image sensor of claim 2 wherein the at least one common source amplifier of each supercell further comprises a capacitor coupled between an output of the common source amplifier and the bond contact of the selected macrocell unit of the supercell.

4. The hybrid bonded image sensor of claim 3 wherein the common source amplifier is coupled to the selectable source follower through a differential amplifier, and wherein a noninverting input of the differential amplifier receives an output of the common source amplifier.

5. The hybrid bonded image sensor of claim 4 wherein the differential amplifier is a distributed differential amplifier having a separate noninverting input for each of a plurality of supercells and a common load.

6. A camera system incorporating the image sensor of claim 5 the image sensor further comprising at least one decoder coupled to drive photodiode select lines of macrocells of the array, to supercell select lines, and column select lines, the camera system further comprising:
   an analog-to-digital converter coupled to receive data from the image sensor,
   at least one counter coupled to the at least one decoder, and
   a digital processor coupled to receive data from the analog-to-digital convertor; and
   wherein the analog-to-digital convertor, counter, and image processor are formed in the supporting circuitry die.

7. The hybrid bonded image sensor of claim 4 wherein the differential amplifier further comprises a first gain-controlling capacitor coupled between an output of the differential amplifier and a noninverting input of the differential amplifier, and a second gain-controlling capacitor coupled to noninverting input of the differential amplifier.

8. A camera system incorporating the image sensor of claim 2, the image sensor further comprising at least one decoder coupled to drive photodiode select lines of macrocells of the array, to supercell select lines, and column select lines, the camera system further comprising:
   an analog-to-digital converter coupled to receive data from the image sensor,
   at least one counter coupled to the at least one decoder, and
   a digital processor coupled to receive data from the analog-to-digital convertor;
   wherein the analog-to-digital convertor, counter, and image processor are formed in the supporting circuitry die; and
   wherein the photodiode die is configured for backside illumination.

* * * * *